US012777693B2

(12) United States Patent
Nakano

(10) Patent No.: US 12,777,693 B2
(45) Date of Patent: Oct. 27, 2026

(54) SEMICONDUCTOR DEVICE AND METHOD FOR MANUFACTURING THE SAME

(71) Applicant: Sumitomo Electric Device Innovations, Inc., Yokohama (JP)

(72) Inventor: Takuma Nakano, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 531 days.

(21) Appl. No.: 18/226,386

(22) Filed: Jul. 26, 2023

(65) Prior Publication Data

US 2024/0088231 A1 Mar. 14, 2024

(30) Foreign Application Priority Data

Sep. 9, 2022 (JP) ................................. 2022-143844

(51) Int. Cl.

| | |
|---|---|
| ***H10W 10/20*** | (2026.01) |
| ***H10D 30/01*** | (2025.01) |
| ***H10D 30/47*** | (2025.01) |
| ***H10D 62/832*** | (2025.01) |
| ***H10D 62/85*** | (2025.01) |

(52) U.S. Cl.

CPC ....... *H10D 62/8325* (2025.01); *H10D 30/015* (2025.01); *H10D 30/475* (2025.01); *H10D 62/8503* (2025.01)

(58) Field of Classification Search

CPC ............. H10D 62/8325; H10D 30/015; H10D 30/475; H10D 62/8503; H10D 64/254; H10D 84/01; H10D 84/05; H10D 84/811; H10W 40/22; H10W 40/253

See application file for complete search history.

(56) References Cited

U.S. PATENT DOCUMENTS

| | | | | |
|---|---|---|---|---|
| 2008/0210989 | A1* | 9/2008 | Naito | H10D 84/82 257/E27.059 |
| 2010/0078776 | A1* | 4/2010 | Barth | H10W 20/023 257/659 |
| 2016/0343809 | A1* | 11/2016 | Green | H10D 62/8503 |
| 2017/0154885 | A1 | 6/2017 | Nagasato et al. | |
| 2022/0084817 | A1* | 3/2022 | Sharma | H10P 14/69215 |
| 2022/0205847 | A1* | 6/2022 | Cavanaugh | G01K 1/12 |
| 2022/0217845 | A1* | 7/2022 | Salmon | G06F 1/20 |

FOREIGN PATENT DOCUMENTS

| | | | | |
|---|---|---|---|---|
| JP | 11-274853 | A | | 10/1999 |
| JP | H11307577 | A | | 11/1999 |
| JP | 2009231371 | A | * | 10/2009 |
| JP | 2011192836 | A | * | 9/2011 |
| JP | 2017098511 | A | | 6/2017 |

* cited by examiner

*Primary Examiner* — Samuel Park
(74) *Attorney, Agent, or Firm* — Volpe Koenig

(57) ABSTRACT

A semiconductor device includes a silicon carbide substrate, a nitride semiconductor layer provided on a top surface of the silicon carbide substrate, a transistor provided on the nitride semiconductor layer, and an element provided on or above the silicon carbide substrate, wherein the silicon carbide substrate has a hole that is provided between the transistor and the element, the hole is formed by removing at least a part of the silicon carbide substrate from a bottom surface of the silicon carbide substrate and an internal thermal conductivity of the hole is smaller than a thermal conductivity of the silicon carbide substrate.

13 Claims, 16 Drawing Sheets

SEMICONDUCTOR DEVICE AND METHOD FOR MANUFACTURING THE SAME

CROSS REFERENCE TO RELATED APPLICATIONS

This application claims priority based on Japanese Patent Application No. 2022-143844, filed on Sep. 9, 2022, and the entire contents of the Japanese patent applications are incorporated herein by reference.

FIELD

The present disclosure relates to a semiconductor device and a method for manufacturing the same.

BACKGROUND

In a high electron mobility transistor (HEMT) having a nitride semiconductor layer, a silicon carbide (SiC) substrate having good thermal conductivity is used. In a monolithic microwave integrated circuit (MMIC), a transistor and a passive element such as a capacitor are provided on the substrate (for example, Patent Document 1: Japanese Patent Application Laid-Open No. 11-274853).

SUMMARY

A semiconductor device according to the present disclosure includes a silicon carbide substrate, a nitride semiconductor layer provided on a top surface of the silicon carbide substrate, a transistor provided on the nitride semiconductor layer; and an element provided on or above the silicon carbide substrate; wherein the silicon carbide substrate has a hole that is provided between the transistor and the element, the hole is formed by removing at least a part of the silicon carbide substrate from a bottom surface of the silicon carbide substrate—and an internal thermal conductivity of the hole is smaller than a thermal conductivity of the silicon carbide substrate.

A method for manufacturing a semiconductor device according to the present disclosure includes forming a transistor on a nitride semiconductor layer provided on a top surface of a silicon carbide substrate to form an element on or above the silicon carbide substrate, forming a mask layer having a first opening and a second opening having an area smaller than an area of the first opening on a bottom surface of the silicon carbide substrate, etching the silicon carbide substrate with the mask layer as a mask to simultaneously form a via hole that is defined by the first opening and penetrates through the silicon carbide substrate and the nitride semiconductor layer, and a hole that is defined by the second opening, has a part of the silicon carbide substrate removed so as not to penetrate through the silicon carbide substrate and the nitride semiconductor layer, and has an internal thermal conductivity smaller than a thermal conductivity of the silicon carbide substrate, and forming a metal layer electrically connected to the transistor via the via hole on the bottom surface of the silicon carbide substrate.

DETAILED DESCRIPTION OF EMBODIMENTS

Figure 1:
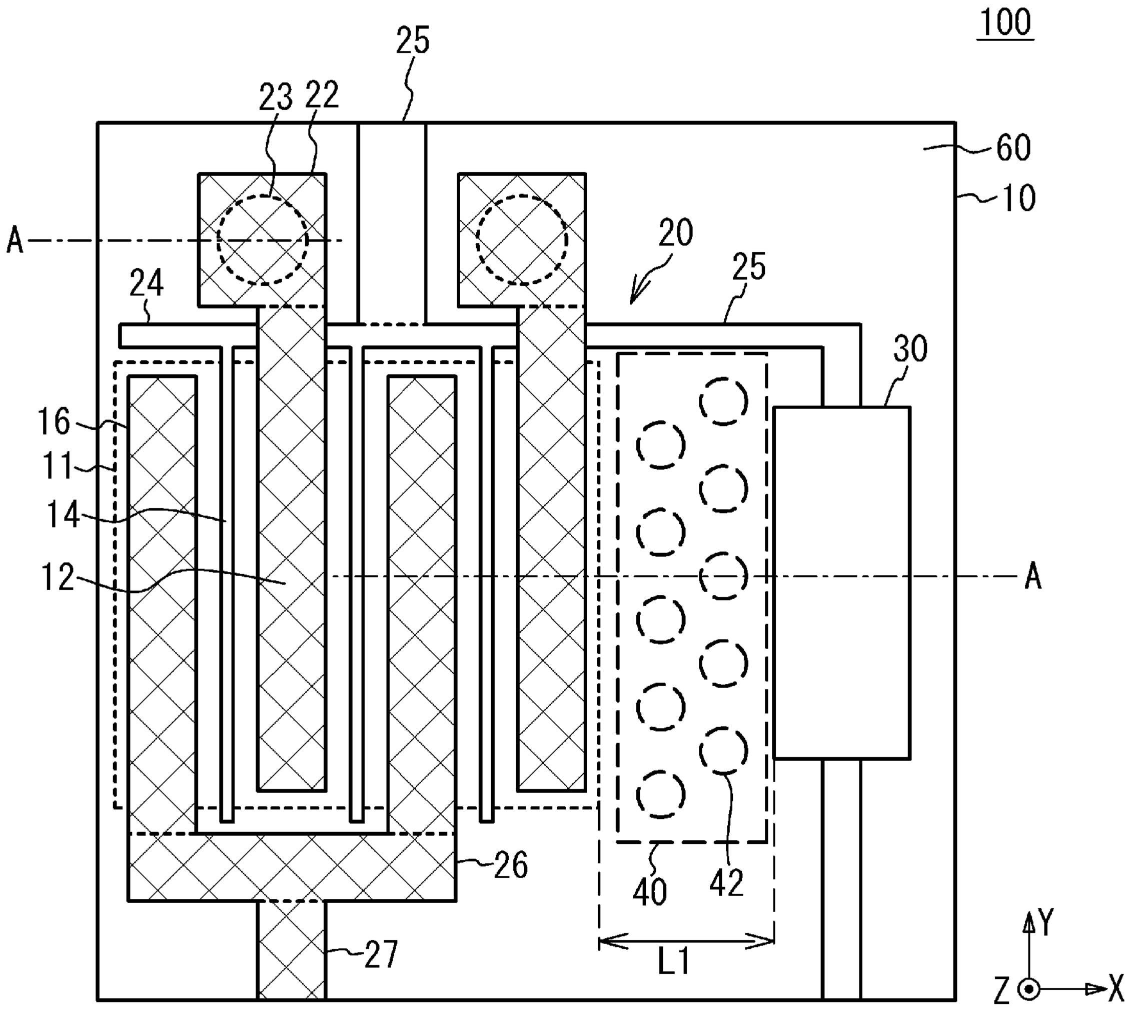
FIG. 1 is a plan view of a semiconductor device according to a first embodiment.

By using the silicon carbide substrate, heat generated in the transistor provided on the nitride semiconductor layer can be efficiently discharged to the back surface of the silicon carbide substrate. However, in an integrated circuit such as the MIMIC, a passive element or an active element is provided in a region adjacent to the transistor. Therefore, heat generated in the transistor is conducted to the passive element or the active element via the silicon carbide substrate. As a result, the temperature of the passive element or the active element may rise, and desired characteristics may not be obtained.

The present disclosure has been made in view of the above problems, and an object of the present disclosure is to suppress conduction of heat generated in the transistor to an element.

Details of Embodiments of the Present Disclosure

First, the contents of the embodiments of this disclosure are listed and explained.

(1) A semiconductor device according to the present disclosure includes a silicon carbide substrate, a nitride semiconductor layer provided on a top surface of the silicon carbide substrate, a transistor provided on the nitride semiconductor layer; and an element provided on or above the silicon carbide substrate; wherein the silicon carbide substrate has a hole that is provided between the transistor and the element, the hole is formed by removing at least a part of the silicon carbide substrate from a bottom surface of the silicon carbide substrate and an internal thermal conductivity of the hole is smaller than a thermal conductivity of the silicon carbide substrate. Thereby, conduction of heat generated in the transistor to the element can be suppressed.

(2) In the above (1), the semiconductor device further may include a metal layer electrically connected to the transistor via a via hole that penetrates through the silicon carbide substrate and the nitride semiconductor layer.

(3) In the above (1), the hole may be provided from a bottom surface of the silicon carbide substrate to the middle of the silicon carbide substrate and may not penetrate through the silicon carbide substrate and the nitride semiconductor layer.

(4) In the above (3), the semiconductor device further may include a metal layer electrically connected to the transistor via a via hole that penetrates through the silicon carbide substrate and the nitride semiconductor layer. A planar area of the hole in the bottom surface of the silicon carbide substrate may be smaller than a planar area of the via hole in the bottom surface of the silicon carbide substrate.

(5) In the above (2), the hole may penetrate through the silicon carbide substrate and the nitride semiconductor layer, and the semiconductor device further may include a pad that is provided on the silicon carbide substrate, overlaps with the hole as viewed from a thickness direction of the silicon carbide substrate, and is in contact with the hole.

(6) In the above (5), the pad may be electrically separated from the metal layer.

(7) In any one of the above (1) to (6), at least a part of the inside of the hole may be an air gap.

(8) In any one of the above (1) to (7), the silicon carbide substrate may have a plurality of holes, and in a front surface of the nitride semiconductor layer, all shortest straight lines from respective points of the transistor to the element may pass through regions where the plurality of holes are projected onto the front surface.

(9) In any one of the above (1) to (8), the element may be a passive element.

(10) In any one of the above (1) to (8), the element may be an active element.

(11) A method for manufacturing a semiconductor device according to the present disclosure includes forming a transistor on a nitride semiconductor layer provided on a top surface of a silicon carbide substrate to form an element on or above the silicon carbide substrate, forming a mask layer having a first opening and a second opening having an area smaller than an area of the first opening on a bottom surface of the silicon carbide substrate, etching the silicon carbide substrate with the mask layer as a mask to simultaneously form a via hole that is defined by the first opening and penetrates through the silicon carbide substrate and the nitride semiconductor layer, and a hole that is defined by the second opening, has a part of the silicon carbide substrate removed so as not to penetrate through the silicon carbide substrate and the nitride semiconductor layer, and has an internal thermal conductivity smaller than a thermal conductivity of the silicon carbide substrate, and forming a metal layer electrically connected to the transistor via the via hole on the bottom surface of the silicon carbide substrate.

Specific examples of the semiconductor device and the method for manufacturing the same in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
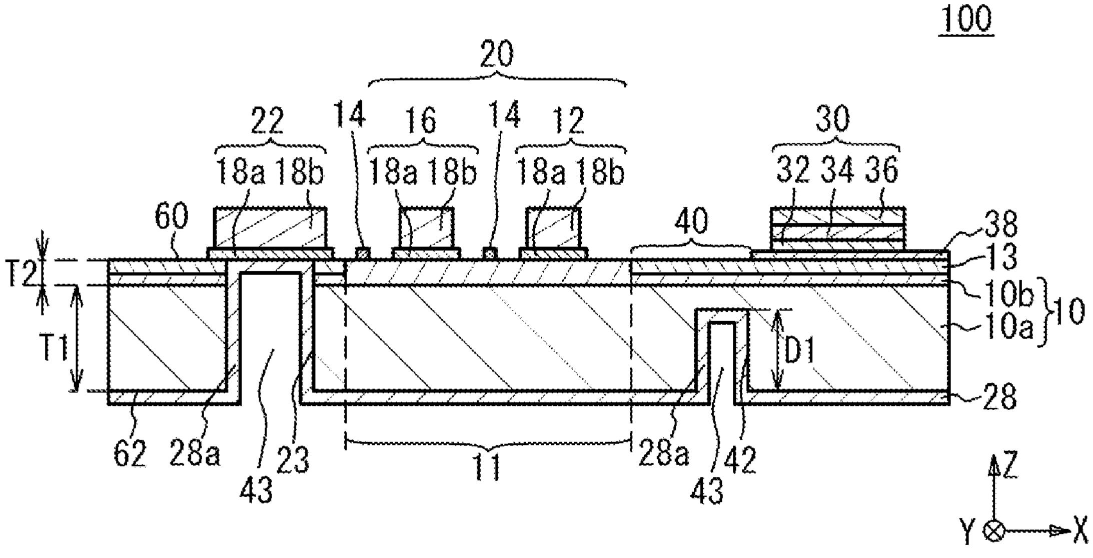
FIG. 2 is a cross-sectional view taken along line A-A of FIG. 1.

FIG. 1 is a plan view of a semiconductor device according to the first embodiment. FIG. 2 is a cross-sectional view taken along line A-A of FIG. 1. It is assumed that a normal direction of the surface of a substrate 10 is a Z direction, an arrangement direction of source electrodes 12, gate electrodes 14 and drain electrodes is an X direction, and an extension direction of the source electrodes 12, the gate electrodes 14 and the drain electrodes 16 is a Y direction. In the plan view of FIG. 1 and the like, the source electrodes 12, the drain electrodes 16, source pads 22, a drain bus bar 26, and a drain wiring 27 are cross-hatched.

As illustrated in FIGS. 1 and 2, in a semiconductor device 100 of the first embodiment, a field effect transistor (FET) 20 and a capacitor 30 are provided on or above the substrate 10.

The substrate 10 includes a substrate 10*a* and a semiconductor layer 10*b* provided on the substrate 10*a*. The substrate 10*a* is a single-crystal silicon carbide substrate, and the semiconductor layer 10*b* is a single-crystal nitride semiconductor layer. An active region 11 is provided on the substrate 10. A region other than the active region 11 is an inactive region 13 in which the semiconductor layer 10*b* is inactivated by ion implantation or the like. That is, the active region 11 is a region in which the semiconductor layer 10*b* in the substrate 10 is activated, and the inactive region 13 is a region in which the semiconductor layer 10*b* is inactivated. The FET 20 is provided in the active region 11. The capacitor 30 is provided in the inactive region 13.

In the FET 20, the source electrode 12 (a source finger), the gate electrode 14 (a gate finger) and the drain electrode 16 (a drain finger) are extended in the Y direction on the active region 11 on a front surface 60 of the substrate 10. The planar shapes of the source electrode 12, the gate electrode 14 and the drain electrode 16 are substantially rectangular, and the longer sides of the rectangle extend in the Y direction. The source electrode 12, the gate electrode 14 and the drain electrode 16 are arranged in the X-direction.

The source electrodes 12 and the drain electrodes 16 are alternately provided in the X direction. The gate electrode 14 is sandwiched between the single source electrode 12 and the single drain electrode 16. The source electrode 12 and the drain electrode 16 sandwiching the gate electrode 14 form a single unit FET. Adjacent unit FETs share the source electrode 12 or the drain electrode 16. The plurality of unit FETs are arranged in the X direction. In FIG. 1, there are three unit FETs, but the number of unit FETs can be set as appropriate.

The source pad 22, a gate bus bar 24 and the drain bus bar 26 are provided on the inactive region 13 of the substrate 10. The gate bus bar 24 and the drain bus bar 26 extend in the X direction. The +Y ends in the Y direction of the plurality of gate electrodes 14 are connected to the gate bus bar 24. The gate bus bar 24 and the source electrode 12 are separated from each other and intersect each other, and are electrically isolated from each other. The −Y ends in the Y direction of the plurality of drain electrodes 16 are connected to the drain bus bar 26. A gate wiring 25 is connected to the gate bus bar 24. The drain wiring 27 is connected to the drain bus bar 26.

Each of the source electrode 12, the drain electrode 16, the source pad 22 and the drain bus bar 26 includes an ohmic metal layer 18*a* and a low resistance layer 18*b* provided on the semiconductor layer 10*b*. The ohmic metal layer 18*a* makes an ohmic contact with the semiconductor layer 10*b*. A material of the low resistance layer 18*b* has a lower resistivity than that of the ohmic metal layer 18*a*. The low resistance layer 18*b* is thicker than the ohmic metal layer 18*a*. Thus, a sheet resistance of the low resistance layer 18*b* is lower than that of the ohmic metal layer 18*a*.

An insulating layer 38 is provided on the inactive region 13 of the substrate 10, and the capacitor 30 is provided on the insulating layer 38. The capacitor 30 is a metal insulator metal (MIM) capacitor and includes a lower electrode 32 provided on the insulating layer 38, a dielectric layer 34 provided on the lower electrode 32, and an upper electrode 36 provided on the dielectric layer 34.

A via hole 23 that penetrates through the substrate 10 from a back surface 62 to the front surface 60 is provided below the source pad 22. A thermal conduction suppressing region 40 is provided in the inactive region 13 between the transistor 20 and the capacitor 30. The thermal conduction suppressing region 40 is provided with a hole 42 extending from the back surface 62 of the substrate 10 to at least a part of the substrate 10. The hole 42 does not extend through the substrate 10. A metal layer 28 is provided on the back surface 62 of the substrate 10. A reference potential such as a ground potential is supplied to the metal layer 28. A metal layer 28*a* is provided on the side and top (i.e., bottom) surfaces of the via hole 23 and the hole 42. The metal layer 28*a* is the same metal layer as the metal layer 28, and the metal layers 28*a* and 28 are formed at the same time. An air gap 43 are provided in the metal layer 28*a* in the via hole 23 and the hole 42. The air gap 43 is filled with a gas such as air. An area of the region in which the hole 42 is projected onto the front surface 60 of the substrate 10 is smaller than an area in which the via hole 23 is projected onto the front surface 60 of the substrate 10. The planar shapes of the via hole 23 and the hole 42 are, for example, a circular shape, an elliptical shape, an elongated shape, an edge-rounded rectangular shape, a track shape, or a polygonal shape.

The substrate 10*a* is a single-crystal silicon carbide substrate and has a hexagonal crystal structure such as 4H or 6H. The semiconductor layer 10*b* includes one or a plurality of nitride semiconductor layers such as gallium nitride (GaN), aluminum gallium nitride (AlGaN), or indium gallium nitride (InGaN). When the transistor 20 is a GaN HEMT, the semiconductor layer 10*b* includes a GaN electron transport layer and an AlGaN barrier layer provided on the GaN electron transport layer. The ohmic metal layer 18*a* is, for example, an adhesion film (for example, a titanium film) provided on the substrate 10 and an aluminum film provided on the adhesion film. The low resistance layer 18*b* is, for example, a gold layer. The gate electrode 14 is, for example, an adhesion film (for example, a nickel film) provided on the substrate 10 and a gold film provided on the adhesion film. The lower electrode 32 and the upper electrode 36 are metal films such as gold films, for example, and the dielectric layer 34 and the insulating layer 38 are silicon nitride films or silicon oxide films, for example. The metal layers 28 and 28*a* are, for example, gold layers.

The length of the gate electrode 14 in the X direction is a gate length, and is, for example, 0.05 μm to 5 μm. The width of the active region 11 in the Y direction is the gate width of the unit FET, and is, for example, 50 μm to 1000 μm. The width of the via hole 23 is, for example, 50 and the width of the hole 42 is, for example, 25 The widths of the transistor 20 and the capacitor 30 in the X direction are, for example, 100 The thickness T1 of the substrate 10*a* is, for example, 10 μm to 200 μm, and is, for example, 50 μm. The thickness T2 of the semiconductor layer 10*b* is smaller than the thickness T1 of the substrate 10*a*, for example, 1 μm to 10 μm. The thickness T2 of the semiconductor layer 10*b* is equal to or less than, for example, ⅕ times the thickness T1 of the substrate 10*a*.

Manufacturing Method of First Embodiment

FIGS. 3A to 4C are cross-sectional views illustrating a method of manufacturing the semiconductor device according to the first embodiment. FIGS. 3B to 4C are illustrated with the top and bottom reversed. The transistor 20 and the capacitor 30 are formed on or above the substrate 10. As illustrated in FIG. 3B, the substrate 10*a* is thinned by grinding or polishing the bottom surface (the top surface in FIG. 3B to 4C) of the substrate 10*a*. As illustrated in FIG. 3C, a mask layer 44 having openings 45*a* and 45*b* is formed on the substrate 10*a*. The mask layer 44 is a metal layer such as a nickel layer or a nickel-chromium alloy layer, for example. An opening area of the opening 45*b* is smaller than that of the opening 45*a*.

Figure 4A:
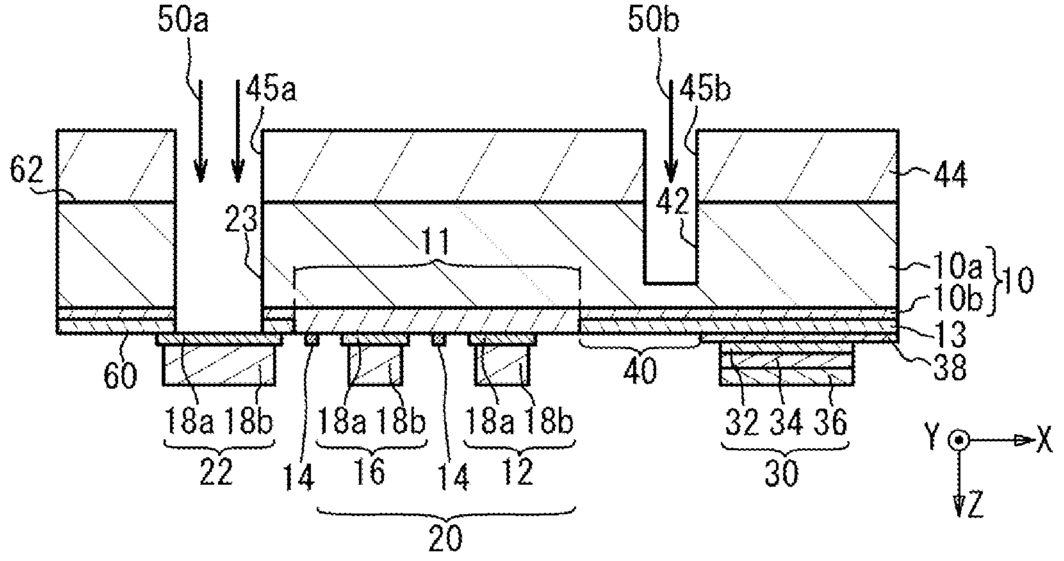
FIG. 4A is a cross-sectional view illustrating a method of manufacturing the semiconductor device according to the first embodiment.

As illustrated in FIG. 4A, the substrate 10 is etched using the mask layer 44 as a mask. By appropriately selecting the etching condition of the substrate 10, the etching rate of the substrate 10 in the opening 45*b* having a small opening area can be made smaller than the etching rate of the substrate 10 in the opening 45*a*. As a result, the via hole 23 that penetrates through the substrate 10 can be formed at the opening 45*a* as indicated by an arrow 50*a*, and the hole 42 that does not penetrate through the substrate 10 can be formed at the opening 45*b* as indicated by an arrow 50*b*.

For example, a reactive ion etching (RIE) method, an inductively coupled plasma (ICP) type etching method, or an electron cyclotron resonance (ECR) type etching method can be used for etching the substrate 10. As the etching gas, a fluorine-based gas such as SF6 or CF4 can be used. When the ICP type etching method is used, a vacuum degree is about 0.1 Pa to 10 Pa. The power for plasma formation is, for example, from 100 W to 3000 W, and the bias power is, for example, from 10 W to 1000 W. As an example, when the diameters of the openings 45*a* and 45*b* are 50 μm and 25 μm, respectively, an etching rate of the silicon carbide substrate 10*a* at the opening 45*b* can be about 80% of an etching rate of the silicon carbide substrate at the opening 45*a*.

Figure 4B:
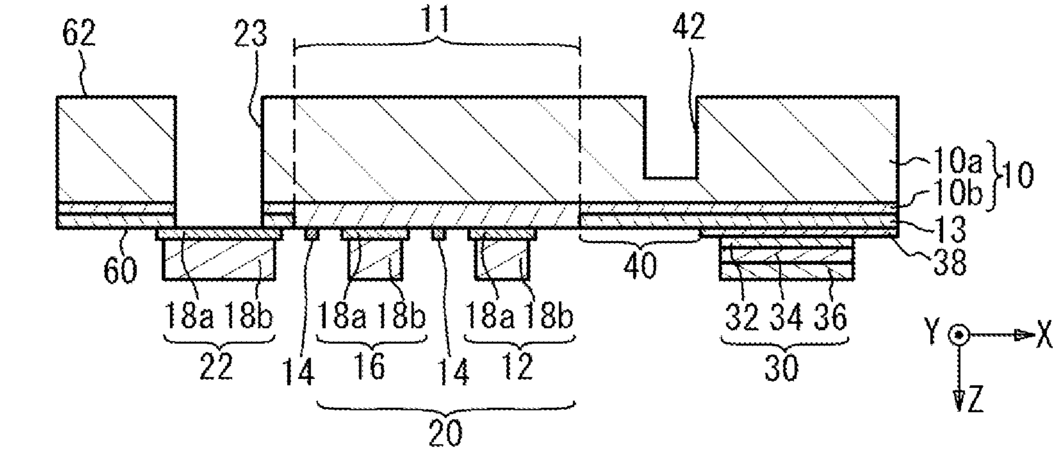
FIG. 4B is a cross-sectional view illustrating a method of manufacturing the semiconductor device according to the first embodiment.
Figure 4C:
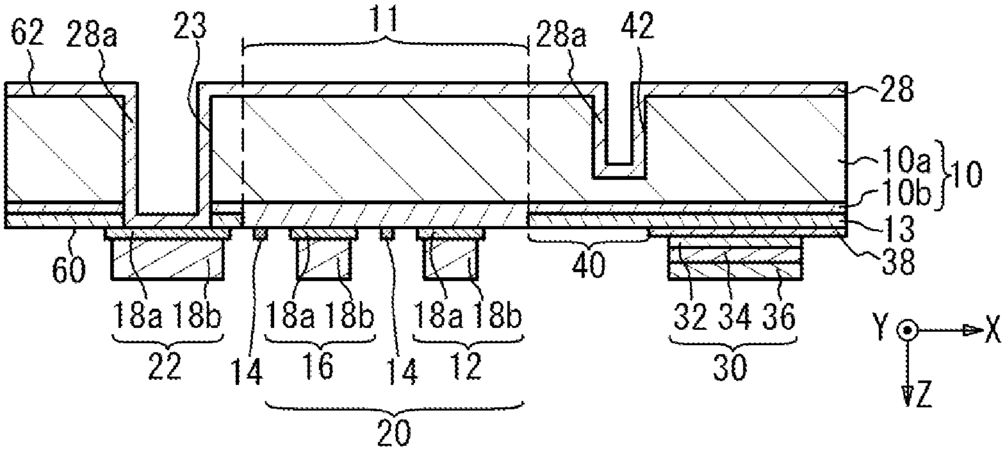
FIG. 4C is a cross-sectional view illustrating a method of manufacturing the semiconductor device according to the first embodiment.

As illustrated in FIG. 4B, the mask layer 44 is removed. When the mask layer 44 is, for example, a nickel layer or a nickel-chromium layer, the mask layer 44 is removed by using a hydrochloric acid solution. As illustrated in FIG. 4C, the metal layer 28 is formed on the back surface 62 of the substrate 10, and the metal layer 28*a* is formed on the side and bottom surfaces of the via holes 23 and the side and bottom surfaces of the holes 42. The metal layers 28 and 28*a* are formed by a plating method, for example. Thus, the semiconductor device according to the first embodiment is manufactured.

First Comparative Example

Figure 5:
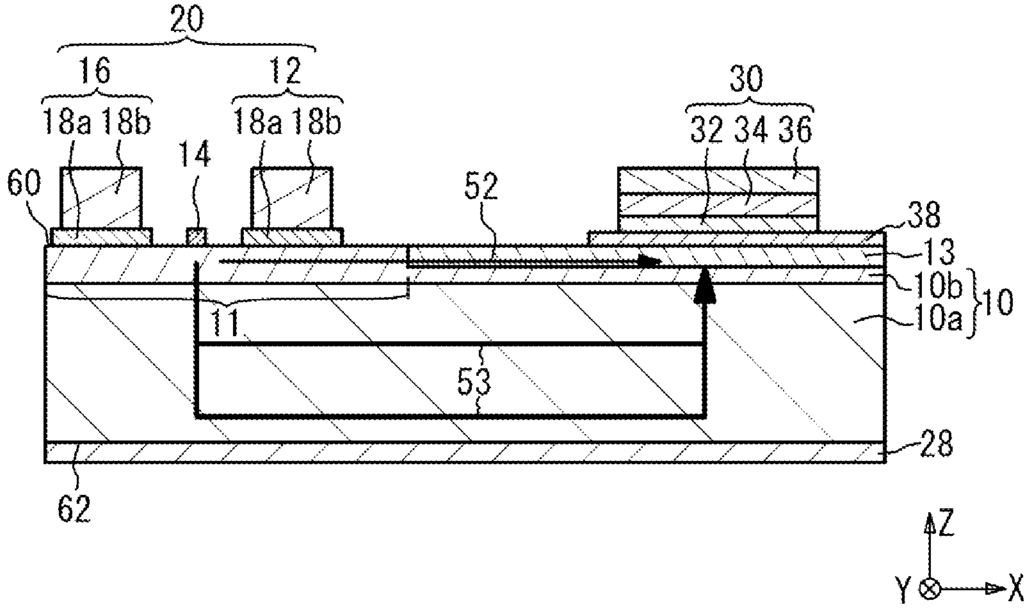
FIG. 5 is a cross-sectional view of a semiconductor device according to a first comparative example.

FIG. 5 is a sectional view of a semiconductor device according to a first comparative example. As illustrated in FIG. 5, in the first comparative example, the thermal conduction suppressing region 40 is not provided between the transistor 20 and the capacitor 30. The thermal conductivity of the single crystal silicon carbide of the hexagonal structure such as 4H and 6H, which is the substrate 10*a*, is 490 W/(m·K). The thermal conductivity of single-crystal GaN which is the semiconductor layer 10*b* is 130 W/(m·K). As described above, when the substrate 10*a* is made of silicon carbide having high thermal conductivity, heat generated in the transistor 20 is efficiently conducted to the back surface 62 of the substrate 10 and radiated from the metal layer 28. For example, when the substrate 10*a* is a silicon substrate, the thermal conductivity of silicon is 150 W/(m·K). By using a silicon carbide substrate as the substrate 10*a*, heat radiation performance can be improved as compared with the case where the substrate 10*a* is the silicon substrate.

In the case where the substrate 10*a* is the silicon carbide substrate and the semiconductor layer 10*b* is a nitride semiconductor, the thermal conductivity of the substrate 10*a* is approximately three times the thermal conductivity of the semiconductor layer 10*b*. In this case, as indicated by an arrow 52, only a small amount of the heat generated in the transistor 20 reaches the capacitor 30 through the semiconductor layer 10*b*. However, as indicated by an arrow 53, heat reaches the capacitor 30 from the transistor 20 via the substrate 10*a*. As a result, the temperature of the capacitor 30 rises. The capacitor 30 is designed to provide a desired performance and lifetime at a desired temperature. When the capacitor 30 is affected by heat generated in the transistor 20, the characteristics of the capacitor 30 deviate from the designed characteristics.

First Embodiment

Figure 6:
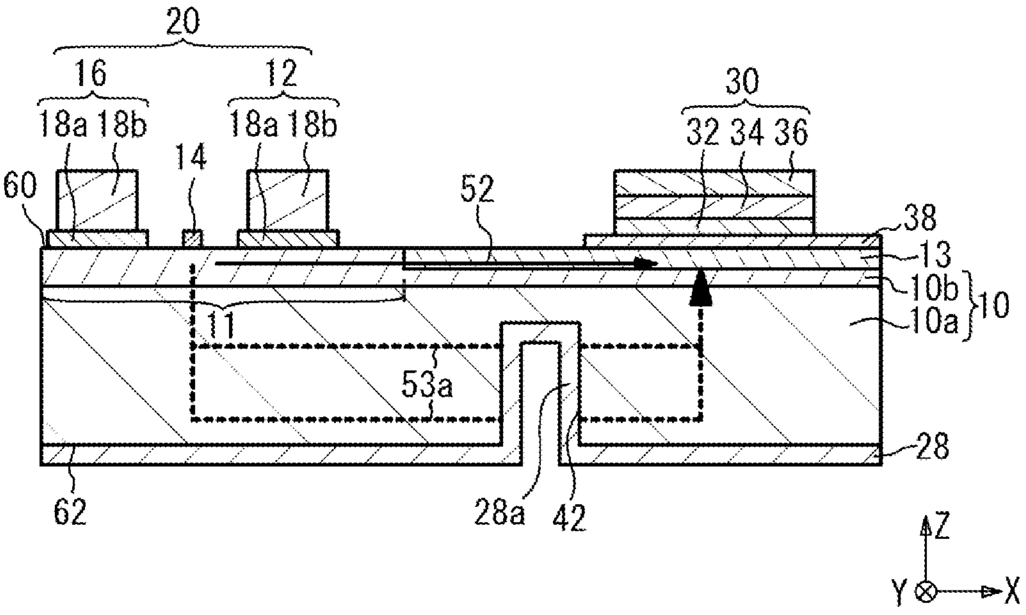
FIG. 6 is a cross-sectional view of the semiconductor device according to the first embodiment.

FIG. 6 is a cross-sectional view of the semiconductor device according to the first embodiment. As illustrated in FIG. 6, in the first embodiment, the semiconductor layer 10*b* (nitride semiconductor layer) is provided on the substrate 10*a* (silicon carbide substrate). The transistor 20 is provided on the active region 11 in which the semiconductor layer 10*b* is activated. The capacitor 30 (element) is provided on the substrate 10. The substrate 10*a* has the hole 42 in the inactive region 13 between the transistor 20 and the capacitor 30. In the hole 42, at least a part of the substrate 10*a* is removed from the back surface 62 of the substrate 10*a*. The thermal conductivity inside the hole 42 (for example, the air gap 43) is smaller than the thermal conductivity of the substrate 10*a*. By providing the hole 42 having an internal thermal conductivity smaller than the thermal conductivity of the substrate 10*a*, thermal conduction from the transistor 20 to the capacitor 30 via the substrate 10*a* as indicated by a dotted arrow 53*a* can be suppressed. Therefore, the influence of heat generated in the transistor 20 on the capacitor 30 can be suppressed, and the characteristics of the capacitor 30 can be suppressed from deviating from the designed characteristics.

Figure 7:
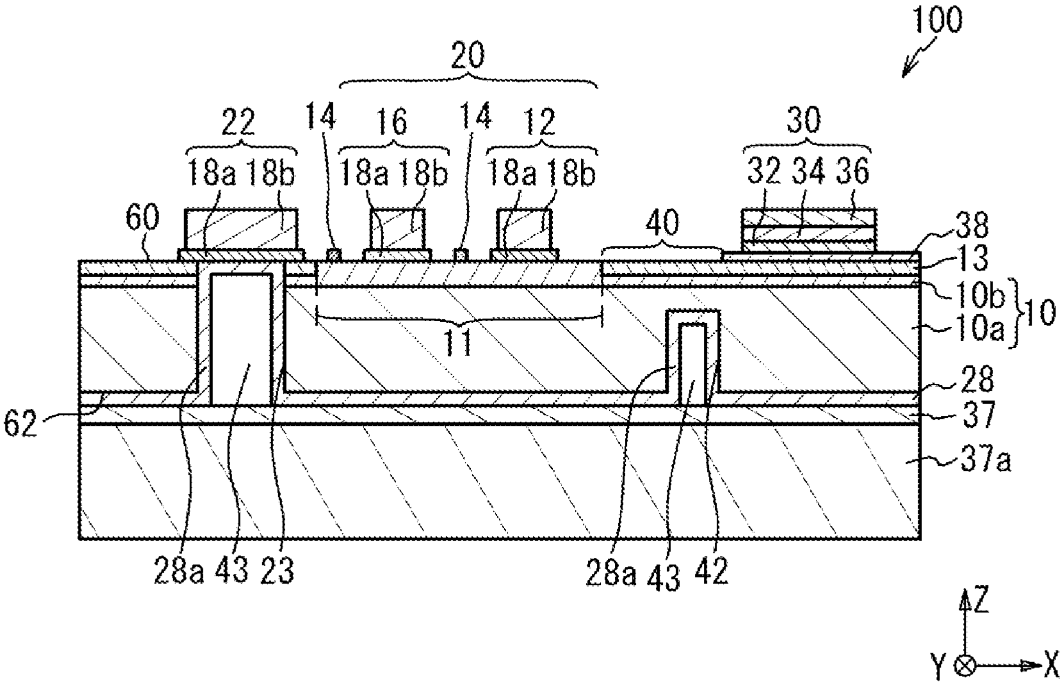
FIG. 7 is a cross-sectional view illustrating an example in which a semiconductor chip is mounted on a mounting substrate in the first embodiment.

FIG. 7 is a cross-sectional view illustrating an example in which a semiconductor chip is mounted on a mounting substrate in the first embodiment. As illustrated in FIG. 7, the semiconductor device 100 of the first embodiment is mounted on a mounting substrate 37*a* using a solder 37. The via hole 23 and the hole 42 are air gaps 43. The thermal conductivity of air is 0.026 W/(m·K), which is equal to or less than 1/1000 of the thermal conductivity of silicon carbide. Thus, by forming the air gap 43 into at least a part of the inside of the hole 42, thermal conduction from the transistor 20 to the capacitor 30 can be suppressed.

Figure 8:
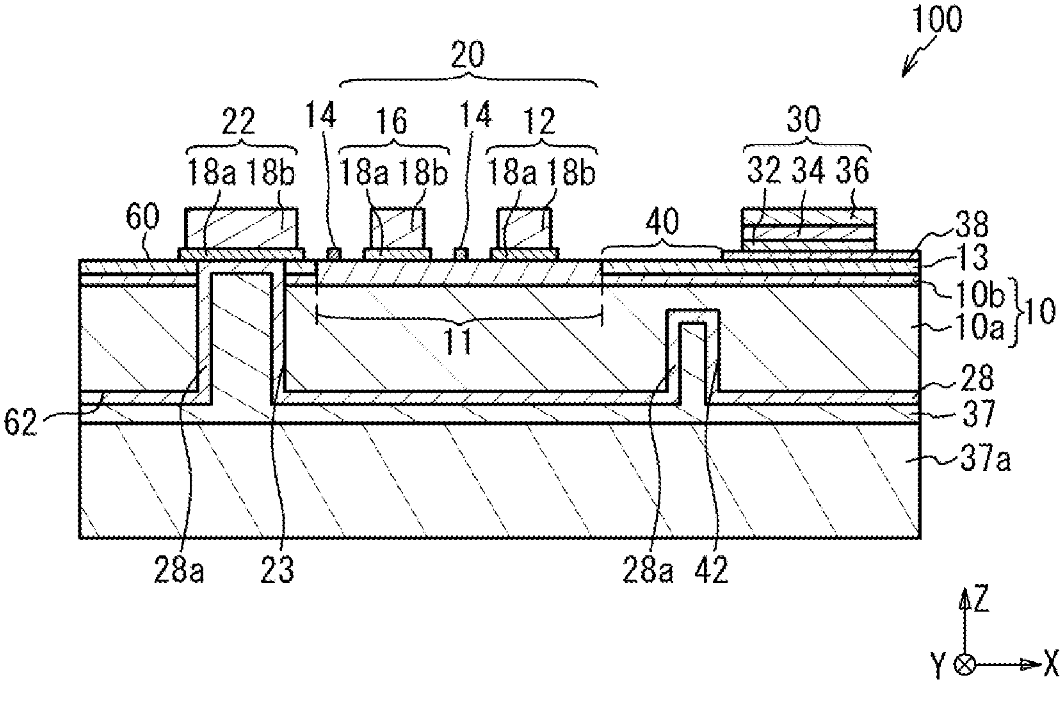
FIG. 8 is a cross-sectional view illustrating another example in which a semiconductor chip is mounted on a mounting substrate in the first embodiment.

FIG. 8 is a cross-sectional view illustrating another example in which the semiconductor chip is mounted on the mounting substrate in the first embodiment. As illustrated in FIG. 8, the via hole 23 and the hole 42 are filled with the solder 37. The thermal conductivity of the solder 37 is lower than that of silicon carbide. For example, the thermal conductivity of tin-silver-copper solder is 55 W/(m·K). Therefore, even when the air gap 43 in the hole 42 is filled with the solder 37, the thermal conduction from the transistor 20 to the capacitor 30 can be suppressed by the hole 42.

Figure 9:
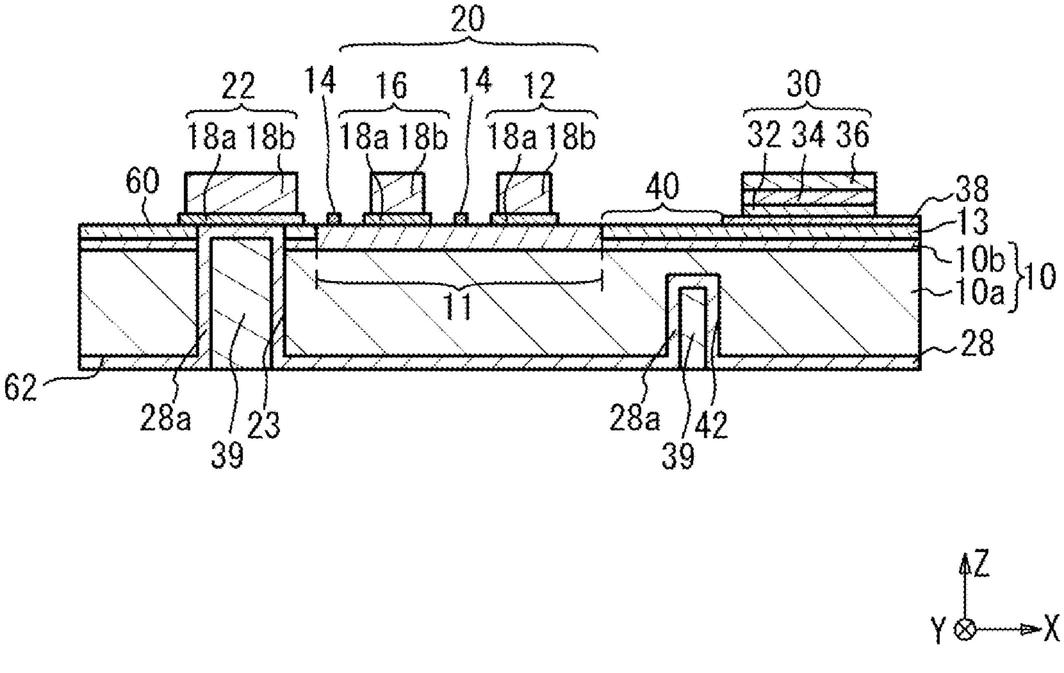
FIG. 9 is a cross-sectional view illustrating another example of the inside of a hole in the first embodiment.

FIG. 9 is a cross-sectional view illustrating another example of the inside of the hole in the first embodiment. As illustrated in FIG. 9, a filler 39 is filled in the hole 42 so as not to form the air gap. Even in such a structure of the hole 42, if the thermal conductivity of the filler 39 is lower than the thermal conductivity of the substrate 10*a*, the thermal conduction from the transistor 20 to the capacitor 30 can be suppressed by the hole 42. The filler 39 is, for example, a resin. The thermal conductivity of the resin is generally low. For example, the thermal conductivity of the epoxy resin is 0.3 W/(m·K). The thermal conductivity of the filler 39 is made lower than that of the solder 37 in FIG. 7. Thus, when the semiconductor device 100 is mounted on the mounting substrate 37*a*, the solder 37 can be prevented from entering the hole 42, and thermal conduction from the transistor 20 to the capacitor 30 can be prevented. The thermal conductivity of the filler 39 is, for example, 1/100 or less and 1/1000 or less of the thermal conductivity of the substrate.

Figure 10:
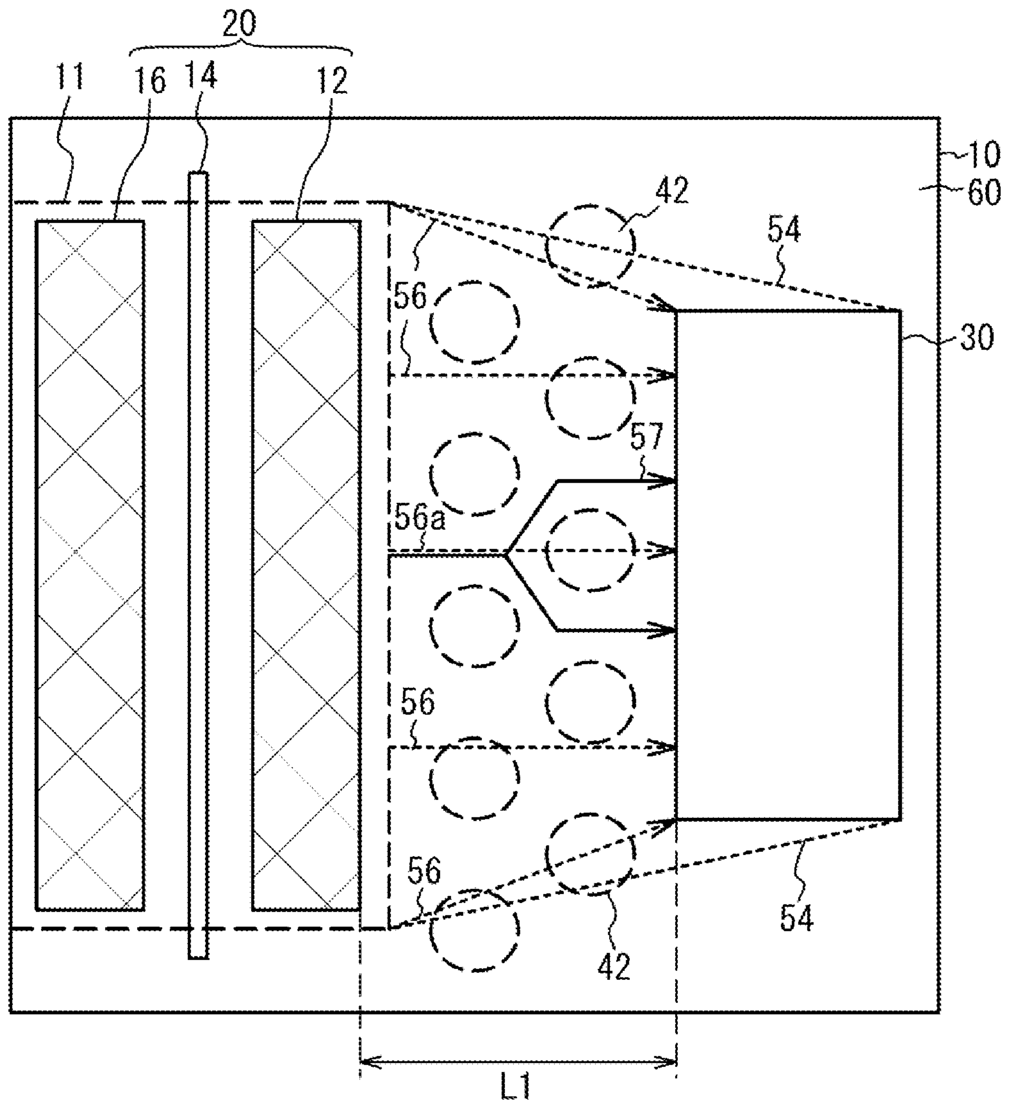
FIG. 10 is an enlarged plan view of the vicinity of a thermal conduction suppression region in the first embodiment.

FIG. 10 is an enlarged plan view of the vicinity of a thermal conduction suppression region in the first embodiment. As illustrated in FIG. 10, a region where heat is generated in the transistor 20 is the active region 11, and the active region 11 corresponds to a region where the transistor 20 is provided. In the front surface 60, a region viewed from the transistor 20 to the capacitor 30 is a region 54. As indicated by arrows 56, in the front surface 60, all shortest straight lines (arrows 56) from respective points of the transistor 20 to the capacitor 30 pass through regions where the holes 42 are projected onto the front surface 60. Thus, when heat is conducted from the active region 11 to the capacitor 30 as indicated by an arrow 56*a*, for example, it bypasses the hole 42 as indicated by arrows 57. Thereby, a distance over which heat is conducted from the transistor 20 to the capacitor 30 is substantially increased. Therefore, thermal conduction from the transistor 20 to the capacitor 30 can be suppressed.

When the hole 42 penetrates through the substrate 10, the metal layer 28*a* is exposed on the front surface 60 of the semiconductor layer 10*b*. The potential of the metal layer 28*a* may affect the transistor 20 or capacitor 30 (e.g., electromagnetic field coupling). In the first embodiment, the hole 42 is provided from the back surface 62 of the substrate 10*a* to the middle of the substrate 10*a*, and does not penetrate through the substrate 10*a* and the semiconductor layer 10*b*. Thus, it is possible to suppress the influence of the potential of the metal layer 28*a* or the like on the front surface 60 of the semiconductor layer 10*b*.

From the viewpoint of suppressing the thermal conduction through the substrate 10*a*, a depth D1 of the hole 42 is 0.5 times or more and 0.8 times or more of the thickness T1 of the substrate 10*a*. When a distance L1 between the transistor 20 and the capacitor 30 is long, the thermal conduction from the transistor 20 to the capacitor 30 is small. When the distance L1 becomes short, the thermal conduction from the transistor 20 to the capacitor 30 tends to become a problem. From this viewpoint, the distance L1 is equal to or less than five times the thickness T1 of the substrate 10*a*, for example.

The metal layer 28 is provided on the back surface 62 of the substrate 10*a* and is electrically connected to the source electrode 12 (electrode) of the transistor 20 via the via hole 23 that penetrates through the substrate 10*a* and the semiconductor layer 10*b*. Thus, by supplying the reference potential such as the ground potential to the metal layer 28, the reference potential can be supplied to the source electrode 12 and a source inductance can be suppressed.

Figure 3A:
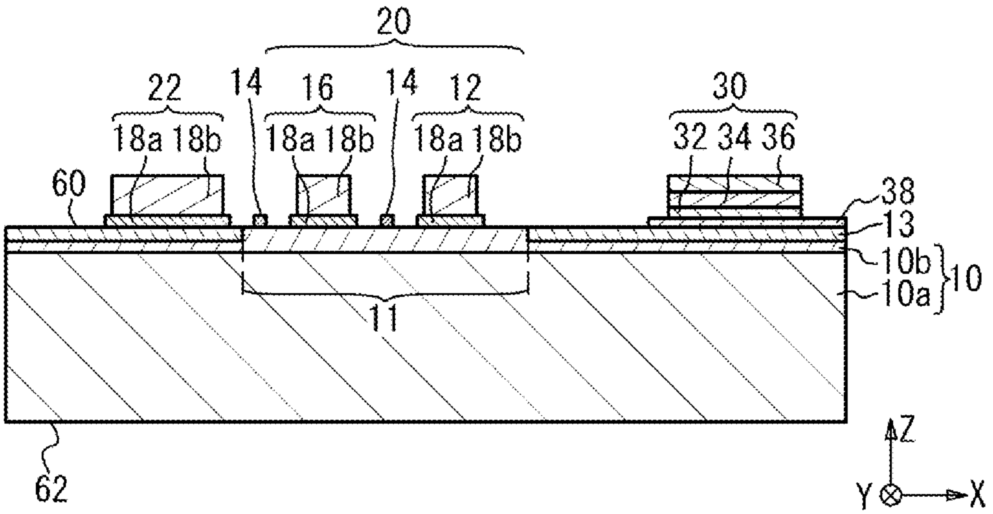
FIG. 3A is a cross-sectional view illustrating a method of manufacturing the semiconductor device according to the first embodiment.
Figure 3B:
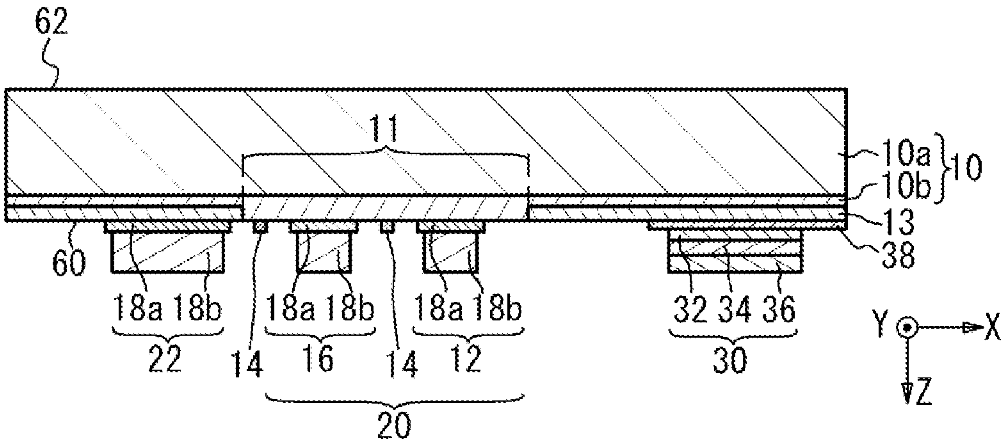
FIG. 3B is a cross-sectional view illustrating a method of manufacturing the semiconductor device according to the first embodiment.
Figure 3C:
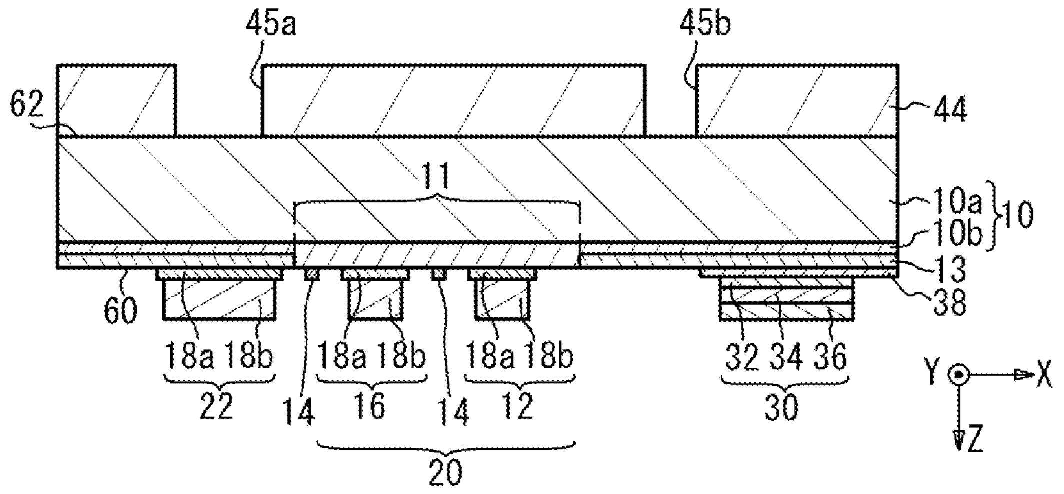
FIG. 3C is a cross-sectional view illustrating a method of manufacturing the semiconductor device according to the first embodiment.

When the via hole 23 and the hole 42 are formed by using different processes, the number of manufacturing processes increases. Thus, as illustrated in FIG. 3C, the mask layer 44 having the opening 45*a* (a first opening) and the opening 45*b* (a second opening) having an area smaller than the area of the opening 45*a* is formed on the substrate 10. As illustrated in FIG. 4A, the substrate 10*a* is etched using the mask layer 44 as the mask. Thus, the via hole 23 that is defined by the opening 45*a* and penetrates through the substrate 10*a* and the semiconductor layer 10*b* and the hole 42 that is defined by the opening 45*b*, is partially removed from the substrate 10*a* and does not penetrate through the substrate 10*a* and the semiconductor layer 10*b* are formed simultaneously. Thus, the via hole 23 and the hole 42 that does not penetrate through the substrate 10 can be formed simultaneously.

When the via hole 23 and the hole 42 are formed as in the first embodiment, a planar area of the hole 42 in the back surface 62 of the substrate 10*a* is smaller than a planar area of the via hole 23 in the back surface 62. The planar area of the hole 42 in the back surface 62 is ½ times or less or ¼ times or less of the planar area of the via hole 23 in the back surface 62. If the planar area of the hole 42 is too small, the depth D1 of the hole 42 becomes small. Therefore, the planar area of the hole 42 in the back surface 62 is 1/50 times or more of the planar area of the via hole 23 in the back surface 62.

Second Embodiment

Figure 11:
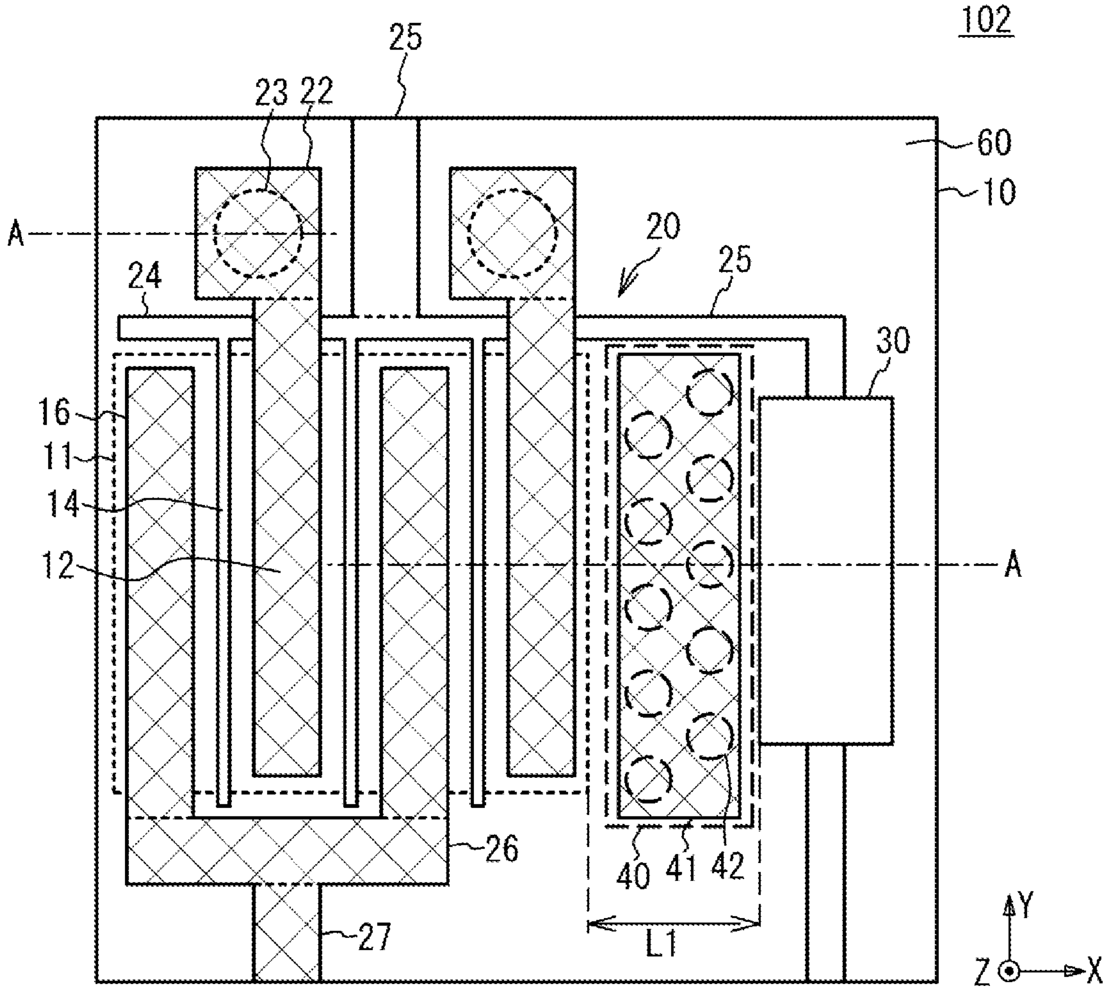
FIG. 11 is a plan view of a semiconductor device according to a second embodiment.
Figure 12:
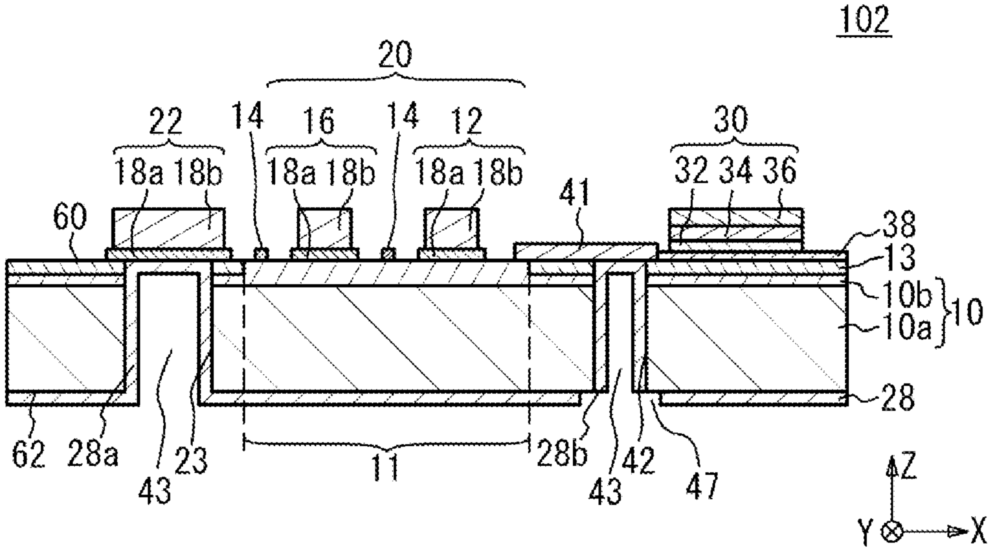
FIG. 12 is a cross-sectional view taken along line A-A of FIG. 11.

FIG. 11 is a plan view of a semiconductor device according to a second embodiment. FIG. 12 is a cross-sectional view taken along the line A-A of FIG. 11. As illustrated in FIGS. 11 and 12, in a semiconductor device 102 of the second embodiment, the hole 42 penetrates through the substrate 10*a* and the semiconductor layer 10*b*. A pad 41 in contact with the hole 42 is provided on the front surface 60 of the semiconductor layer 10*b*. The pad 41 is, for example, the ohmic metal layer 18*a*, the low resistance layer 18*b* or a laminated film made of the ohmic metal layer 18*a* and the low resistance layer 18*b*. A metal layer 28*b* is provided on the side surfaces and the top surface of the hole 42. The metal layer 28 provided on the back surface 62 of the substrate 10*a* and the metal layer 28*b* are electrically separated from each other by a separation portion 47.

An etching selectivity ratio between silicon carbide and nitride semiconductor is small. Therefore, in FIG. 4A, when the hole 42 is formed, it is difficult to make the semiconductor layer 10*b*, which is the nitride semiconductor layer, function as an etching stopper layer for the substrate 10*a*. Therefore, the pad 41 that overlaps with the hole 42 is provided as viewed from the Z direction (i.e., a thickness direction of the substrate 10*a*). The material of the pad 41 is a material (for example, metal such as gold) having a high etching selectivity with respect to the silicon carbide and the nitride semiconductor layer. Thus, when the hole 42 is formed, over-etching can be performed so that the hole 42 can penetrate the substrate 10. The hole 42 is in contact with the pad 41. Other configurations are the same as those of the first embodiment, and description thereof is omitted.

When the pad 41 is electrically connected to the metal layer 28, the pad 41 becomes, for example, the reference potential and is electromagnetically coupled to the transistor 20 and the capacitor 30. Thus, the pad 41 affects the transistor 20 and the capacitor 30. For example, the parasitic capacitance of the transistor 20 and the capacitor increases. Therefore, the pad 41 is electrically separated from the metal layer 28. The potential of the pad 41 is a floating potential, and is not electrically connected to any electrode of the transistor 20 or the capacitor 30. Thus, interference between the pad 41, and the transistor 20 and the capacitor 30 can be suppressed.

First Variation of Second Embodiment

Figure 13:
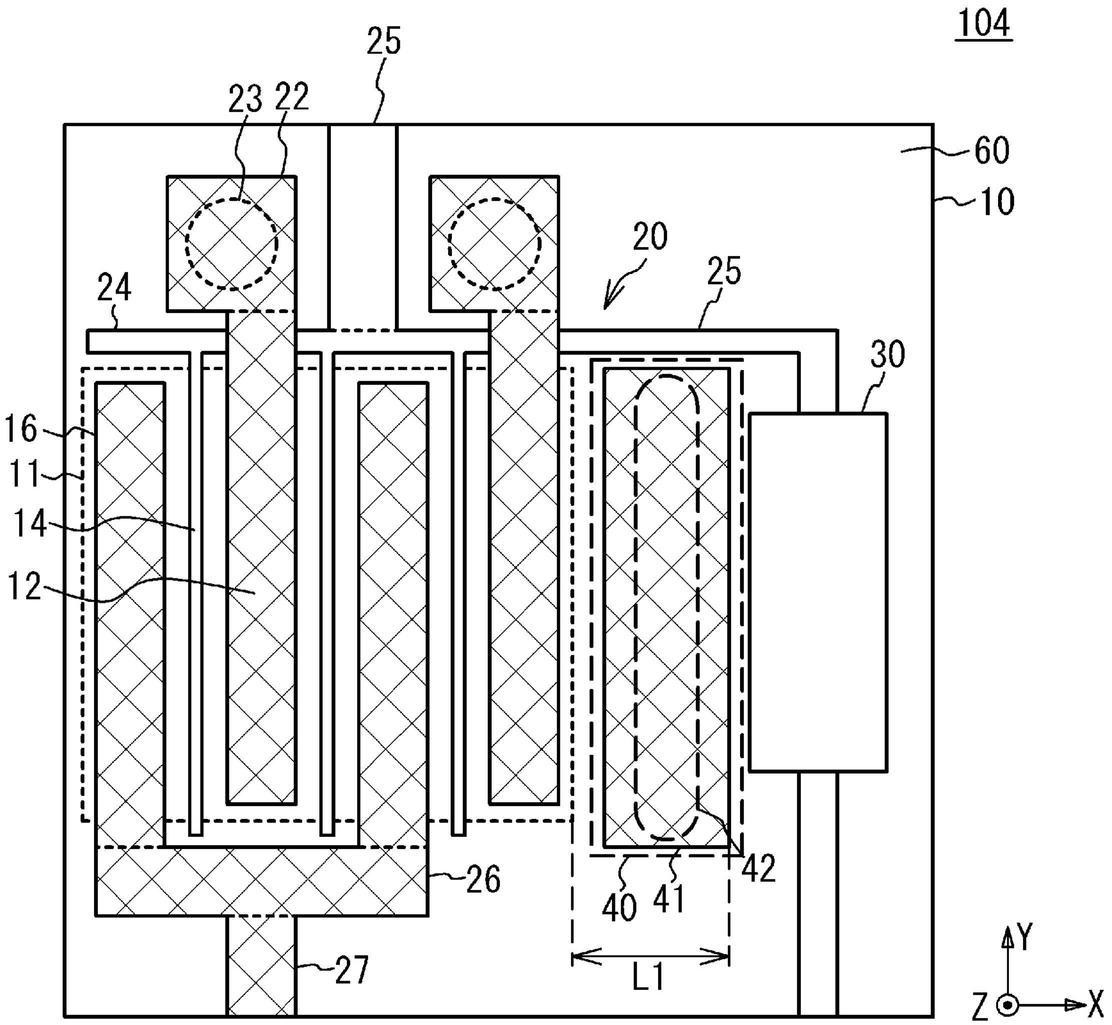
FIG. 13 is a plan view of a semiconductor device according to a first variation of the second embodiment.

FIG. 13 is a plan view of a semiconductor device according to a first variation of the second embodiment. As illustrated in FIG. 13, in a semiconductor device 104 of the first variation of the second embodiment, the planar area of the hole 42 is larger than the planar area of the via hole 23. If the planar area of the hole 42 is larger than the planar area of the via hole 23, the hole 42 penetrates through the substrate 10*a* and the semiconductor layer 10*b*. By providing the pad 41, the etching is stopped by the pad 41. Further, by providing the separation portion 47 (see FIG. 12), the interference of the pad 41 with respect to the transistor 20 and the capacitor 30 can be suppressed. The hole 42 crosses a region as viewed from the active region 11 to the capacitor 30 in the front surface 60. Thus, the thermal conduction from the transistor 20 to the capacitor 30 can be further suppressed. Other configurations are the same as those of the second embodiment, and description thereof is omitted.

Third Embodiment

Figure 14:
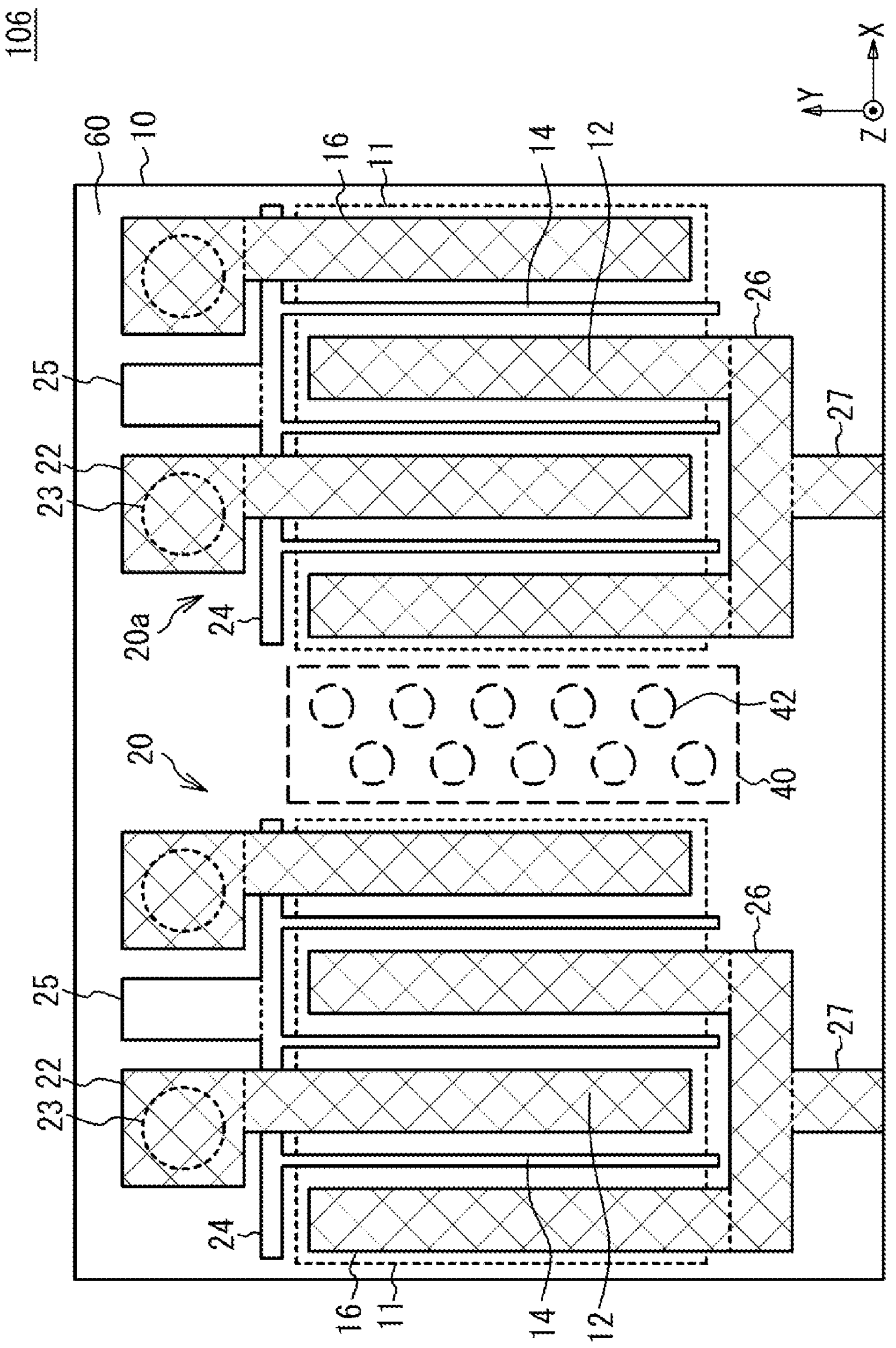
FIG. 14 is a plan view of a semiconductor device according to a third embodiment.

FIG. 14 is a plan view of a semiconductor device according to a third embodiment. As illustrated in FIG. 14, in a semiconductor device 106 of the third embodiment, a transistor 20*a* is provided instead of the capacitor 30. The thermal conduction suppressing region 40 is provided between the transistors 20 and 20*a*. Other configurations are the same as those of the first embodiment, and description thereof is omitted.

As in the first and second embodiments and the variation of the second embodiment, the element sandwiching the thermal conduction suppressing region 40 between itself and the transistor 20 may be the passive element such as the capacitor 30, a resistor or an inductor. As in the third embodiment, the element sandwiching the thermal conduction suppressing region 40 between itself and the transistor 20 may be the active element such as the transistor 20*a* or a diode.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:

a silicon carbide substrate comprising a hole configured from a bottom surface of the silicon carbide substrate and extending at least into the silicon carbide substrate toward a top surface of the silicon carbide substrate;

a nitride semiconductor layer provided on the top surface of the silicon carbide substrate;

a transistor provided on the nitride semiconductor layer; and an element provided on or above the silicon carbide substrate at a distance from the transistor that is equal to or less than five times a thickness of the silicon carbide substrate;

wherein, the hole is positioned between the element and the transistor the semiconductor device in a plan view, and below an inactive region of the nitride semiconductor layer, wherein the hole comprises an internal thermal conductivity that is smaller than a thermal conductivity of the silicon carbide substrate that suppresses thermal conduction from the transistor to the element.

2. The semiconductor device according to claim 1, further comprising:

a metal layer electrically connected to the transistor via a via hole that penetrates through the silicon carbide substrate and the nitride semiconductor layer.

3. The semiconductor device according to claim 1, wherein the hole is provided from a bottom surface of the silicon carbide substrate to the middle of the silicon carbide substrate and does not penetrate through the silicon carbide substrate and the nitride semiconductor layer.

4. The semiconductor device according to claim 3, further comprising:

a metal layer electrically connected to the transistor via a via hole that penetrates through the silicon carbide substrate and the nitride semiconductor layer;

wherein a planar area of the hole in the bottom surface of the silicon carbide substrate is smaller than a planar area of the via hole in the bottom surface of the silicon carbide substrate.

5. The semiconductor device according to claim 2, wherein the hole penetrates through the silicon carbide substrate and the nitride semiconductor layer, and the semiconductor device further comprises a pad that is provided on or above the silicon carbide substrate, overlaps with the hole as viewed from a thickness direction of the silicon carbide substrate, and is in contact with the hole.

6. The semiconductor device according to claim 5, wherein the pad is electrically separated from the metal layer.

7. The semiconductor device according to claim 1, wherein at least a part of an inside of the hole is an air gap.

8. The semiconductor device according to claim 1, wherein the silicon carbide substrate has a plurality of holes, and in a front surface of the nitride semiconductor layer, all shortest straight lines from respective points of the transistor to the element pass through regions where the plurality of holes are projected onto the front surface.

9. The semiconductor device according to claim 1, wherein the element is a passive element.

10. The semiconductor device according to claim 1, wherein the element is an active element.

11. The semiconductor device according to claim 1, wherein a depth of the hole is 0.5 times or more of a thickness of the silicon carbide substrate.

12. The semiconductor device according to claim 1, wherein a thermal conductivity inside the hole is $1/100$ or less of the thermal conductivity of the silicon carbide substrate.

13. The semiconductor device according to claim 1, wherein the element is a capacitor comprising a lower electrode provided on an insulating layer, a dielectric layer provided on the lower electrode, and an upper electrode provided on the dielectric layer.

* * * * *